(12) United States Patent
Jordan et al.

(10) Patent No.: US 6,597,207 B1
(45) Date of Patent: Jul. 22, 2003

(54) VERNIER STRUCTURES THAT SUBSTANTIALLY ELIMINATE OFFSET SIGNALS

(75) Inventors: Edward Perry Jordan, Kernersville, NC (US); Royal A. Gosser, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/272,735

(22) Filed: Oct. 16, 2002

Related U.S. Application Data
(60) Provisional application No. 60/379,333, filed on May 8, 2002, provisional application No. 60/379,383, filed on May 8, 2002, and provisional application No. 60/379,590, filed on May 8, 2002.

(51) Int. Cl.[7] ............................. H03K 5/153; G11C 7/06
(52) U.S. Cl. ........................................... 327/55; 327/65
(58) Field of Search ................................ 327/51–57, 65, 327/66, 67, 77, 89, 560–563, 307; 330/252, 253

(56) References Cited

U.S. PATENT DOCUMENTS 4,884,042 A * 11/1989 Menon et al. .......... 331/113 R
6,060,933 A    5/2000 Jordan
6,278,299 B1 * 8/2001 Madni et al. ................ 327/103
6,400,219 B1 * 6/2002 Fayed ............................ 330/9
6,515,518 B1 * 2/2003 Minegishi .................... 327/65
6,542,019 B1 * 4/2003 Lim et al. ..................... 327/65

OTHER PUBLICATIONS

Gary, Paul R., et al., *Analysis and Design of Analog Integrated Circutis*, John Wiley & Sons, New York, 1993, third edition, pp. 670–681.

AD 8320 Serial Digital Controlled Variable Line Driver Data Sheet, Analog Devices, Inc., One Technology Way, Norwood, MA 09062, pp. 1–14.

MAX2683 Low–Cost High–Performance 3.5 GHz Upconverter Data Sheet, Maxim Integrated Products, 120 San Gabriel Drive, Sunnyvale, CA 94086, pp. 1–7.

* cited by examiner

*Primary Examiner*—Toan Tran
(74) *Attorney, Agent, or Firm*—Koppel, Jacobs, Patrick & Heybl

(57) ABSTRACT

Verniers are provided that substantially eliminate DC offset signals as they convert a differential input signal $S_{in}$ to a differential output signal $S_{out}$ with a conversion gain that corresponds to a digital command signal. The verniers are especially suited for use with multiplying digital-to-analog converters (MDACs) in communication systems. An exemplary use is forming line drivers to drive load impedances (e.g., coaxial cables).

24 Claims, 4 Drawing Sheets

VERNIER STRUCTURES THAT SUBSTANTIALLY ELIMINATE OFFSET SIGNALS

CROSS REFERENCES TO RELATED APPLICATIONS

This application refers to and claims the benefit of U.S. Provisional Applications Serial Nos. 60/379,333, 60/379,383 and 60/379,590 which were filed May 8, 2002.

BACKGROUND OF THE INVENTION

1. Field of the Invention

The present invention relates generally to vernier amplifiers.

2. Description of the Related Art

Digital-to-analog converters (DACs) convert digital input signals to corresponding analog output signals. In a typical DAC embodiment, an internal reference signal (e.g., a reference current) is mirrored to form a plurality of currents which flow through switches that respond to a digital command signal. The combined currents thus form an analog output current that corresponds to the digital input signal.

In a multiplying digital-to-analog converter (MDAC), an input signal $S_{in}$ is received so as to modify the internal reference signal and thus the input signal $S_{in}$ is converted to an analog output signal $S_{out}$ with a conversion gain that corresponds to the digital command signal.

The conversion gain of MDACs are often configured to provide coarse gain steps (e.g., 6 dB steps) which are then filled in with fine gain steps (e.g., 1 dB) from a vernier (that provides the MDAC's reference signal) so that the combined system has a fine resolution over its entire operational range. MDACs, however, generally produce spurious signals in response to any direct-current (DC) offsets in their reference signal and it has been found that typical vernier structures are prone to generate such offsets in response to changes in their digital command signal.

BRIEF SUMMARY OF THE INVENTION

The present invention is directed to verniers that substantially eliminate DC offset signals as they convert a differential input signal $S_{in}$ to a differential output signal $S_{out}$ with a conversion gain that corresponds to a digital command signal.

These goals are realized with various combinations of differential input pairs of transistors, pairs of reference transistors, pairs of subtraction transistors, differential pairs of reference transistors and differential pairs of subtraction transistors. These transistors are arranged to steer the current of one current source to other current sources so as to generate differential output currents with substantial elimination of offset currents.

The novel features of the invention are set forth with particularity in the appended claims. The invention will be best understood from the following description when read in conjunction with the accompanying drawings.

DETAILED DESCRIPTION OF THE INVENTION

Verniers are especially useful in providing fine gain steps to fill in coarse gain steps of another gain structure. Because coarse-step gain structures (e.g., MDACs) often generate spurious signals in response to DC offset currents in their reference signal, the present invention provides vernier embodiments which substantially eliminate such offsets.

Figure 1:
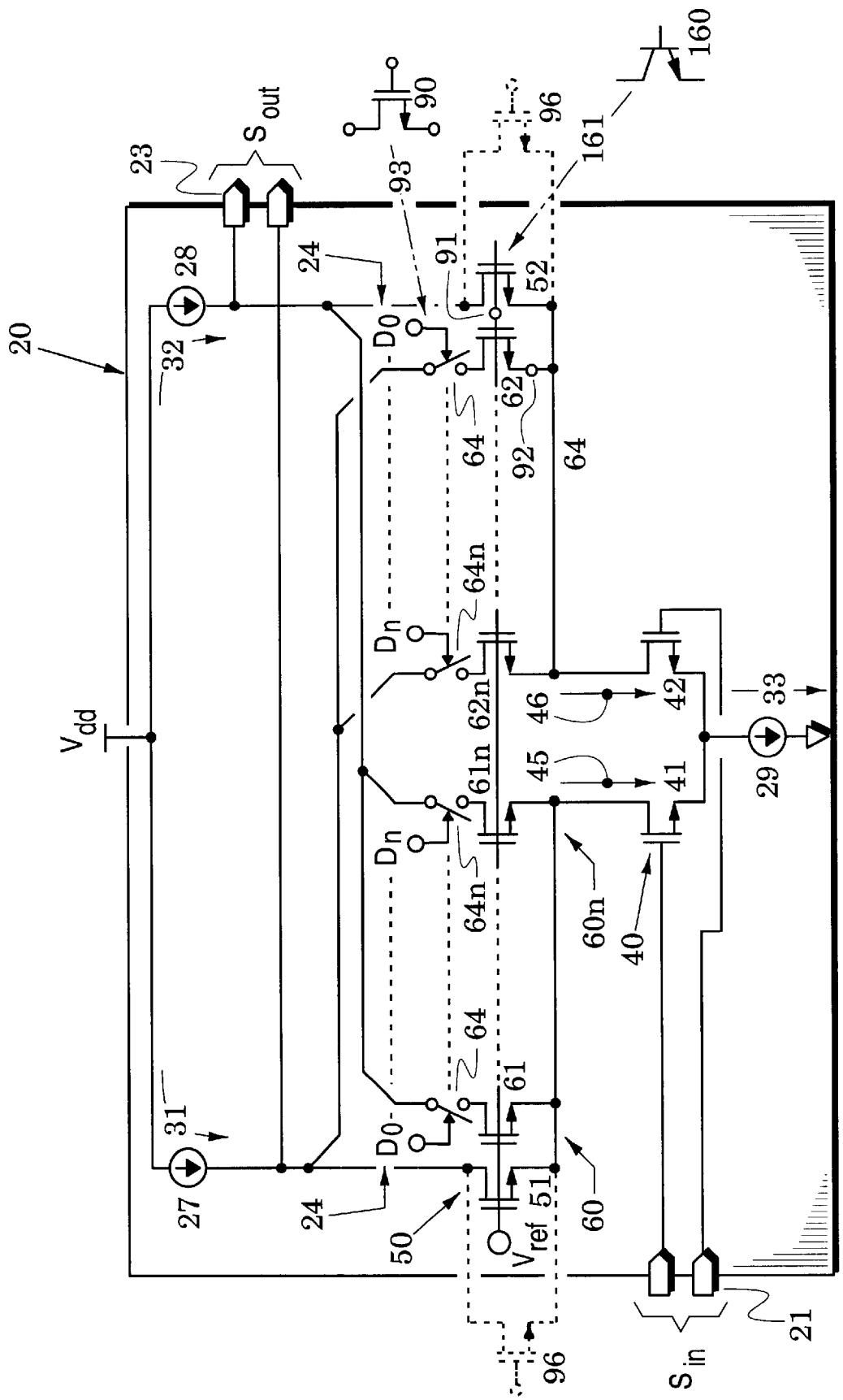
FIG. 1 is a schematic of an vernier embodiment of the present invention.

FIG. 1, for example, introduces a vernier embodiment 20 which converts a differential input signal $S_{in}$ at an input port 21 to a differential output signal $S_{out}$ (typically an output current) at an output port 23 with a conversion gain that corresponds to a digital command signal 24.

The vernier 20 includes first, second and third current sources 27, 28 and 29 that respectively provide first, second and third currents 31, 32 and 33. The vernier further includes an input differential pair 40 of first and second input transistors 41 and 42. Control terminals (gates) of the input transistors are coupled to the input port 21 and current terminals (sources) are coupled to the third current source 29. In response to the differential input signal $S_{in}$, the input differential pair 40 steers the third current along first and second current paths 45 and 46 which lead away from other current terminals (drains) of the input differential pair.

The vernier also includes a pair 50 of first and second reference transistors 51 and 52 that respectively couple the first current path 45 to the first current source 27 and couple the second current path 46 to the second current source 28. Finally, the vernier includes at least one pair 60 of first and second reference transistors 61 and 62 that, in response to the digital command signal 24, respectively couple the first current path 45 to the second current source 28 and couple the second current path 46 to the first current source 27.

In more detail, control terminals (gates) of the first and second reference transistors 51 and 52 and of the first and second subtraction transistors 61 and 62 are biased by a common bias signal $V_{bias}$. Current terminals (sources) of the first and second reference transistors 51 and 52 and of the first and second subtraction transistors 61 and 62 are respectively connected to the first and second current paths 45 and 46.

Output current terminals (drains) of the first reference transistor 51 and the second subtraction transistor 62 are coupled to the first current source 27 (the second subtraction transistor 62 is coupled through a switch 64) while output current terminals of the second reference transistor 52 and the first subtraction transistor 61 are coupled to the second current source 28 (the first subtraction transistor 61 is coupled through a switch 64).

The output current terminals of the pair 50 of first and second reference transistors and the pair 60 of first and second subtraction transistors are, therefore, cross coupled to the first and second current sources 27 and 28. For example, a current along the current path 45 is coupled to the first current source 27 by the first reference transistor 51 but a current along the same current path 45 will be cross coupled to the second current source 28 by the first subtraction transistor 61 when it is activated by the first bit $D_0$ of the digital command signal 24.

Operation of the vernier 20 is best described with reference to a particular embodiment. For this purpose, therefore, it is initially assumed that the first and second currents 31 and 32 are substantially equal and the third current 33 is substantially equal to the sum of the first and second currents. It is also initially assumed that the first and second reference transistors have substantially equal device sizes and the first and second subtraction transistors have substantially equal device sizes.

If none of the pairs 60 of subtraction transistors is turned on by the digital command signal 24 and if the differential input signal is initially zero, one half of the third current will be steered to each of the current paths 45 and 46 and coupled through the reference transistors 51 and 52 to the first and second current sources 27 and 28. Because these steered currents are each one half of the third current 33, they respectively match the first and second currents 31 and 32 so that there is no current passing through the output port 23. In particular, there is no DC offset current from the output port 23.

As the differential input signal 21 begins to increase from zero, the input differential pair 40 will begin to steer different portions of the third current 33 along the first and second current paths 45 and 46. As the amplitude of the differential input signal 21 continues to increase, it will reach an amplitude that steers all of the third current 33 back and forth between the the first and second current paths 45 and 46.

Figure 2:
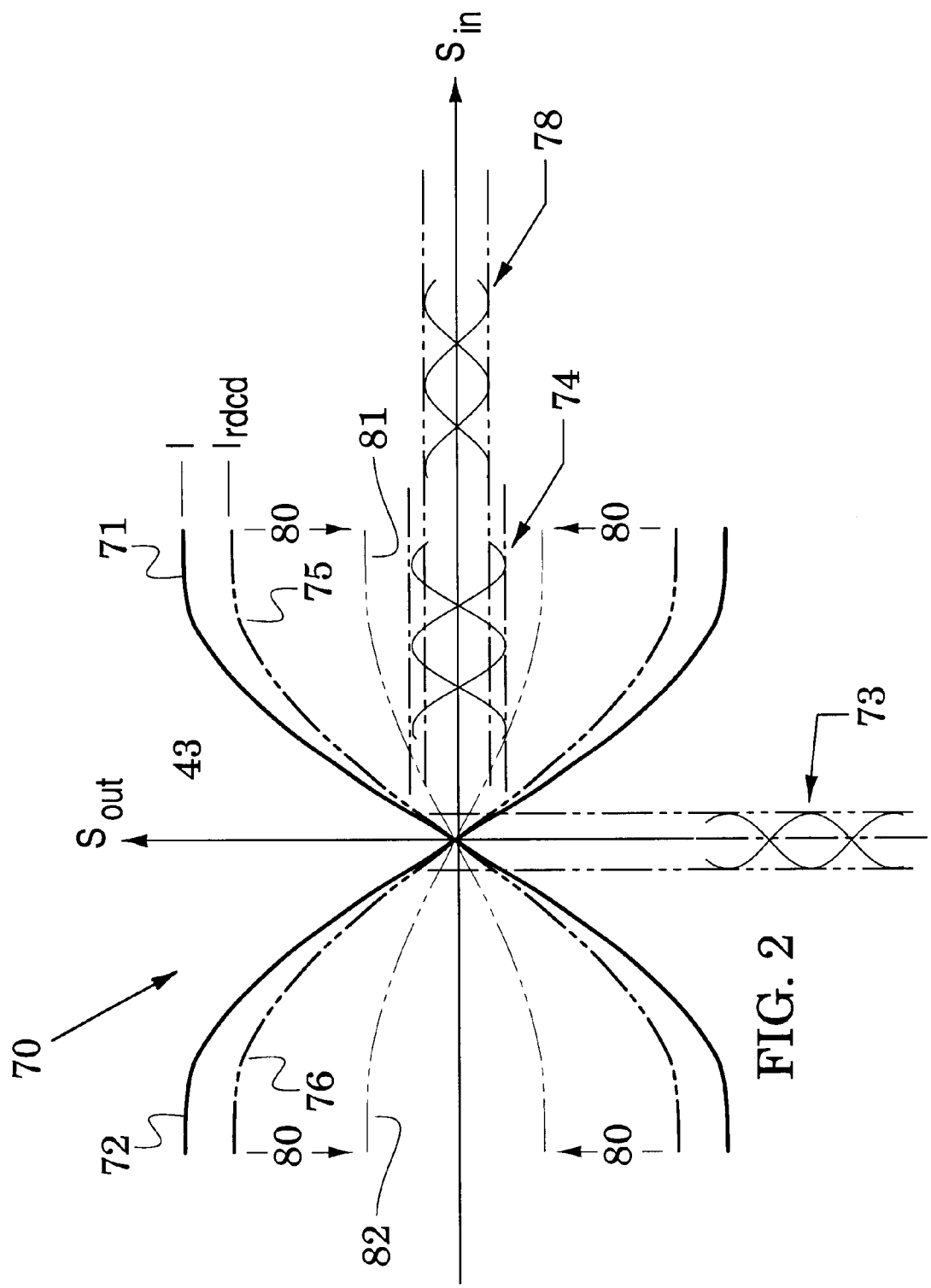
FIG. 2 is a graph that illustrates a transfer characteristic of the vernier of FIG. 1.

This operation is illustrated in the graph 70 of FIG. 2 where bold, solid plots 71 and 72 show the differential transfer characteristic just described. Plot 71, for example, shows output current at one side of the output port (23 in FIG. 1) and plot 72 shows output current at the other side. Note, in this example, that the plots have maximum amplitudes equal to±I (an exemplary±I is shown for the plot 71) wherein I is the amplitude of each of the first and second currents (31 and 32 in FIG. 1). An exemplary differential input signal 73 is shown and its intersection with the transfer characteristic represented by plots 71 and 72 generates a corresponding differential output signal 74 which would issue from the output port (23 in FIG. 1).

Although various transistor types can be used, the vernier embodiment of FIG. 1 is realized with metal-oxide-semiconductor (MOS) transistors which have gates that are configured with a length L and a width W. If the gate of the first reference transistor 51 has a reference width W and the gate of the first subtraction transistor 61 has a subtraction width W/A and the switch 64 corresponding to the first subtraction transistor 61 is turned on, then the current through the first current path 45 will divide with a reduced current $I_{rdcd}$ flowing through the reference transistor 51 and a subtraction current $I_{rdcd}/A$ flowing through the first subtraction transistor 61 wherein $I_{rdcd}+I_{rdcd}/A=I$.

Because of the cross coupling described above, the current $I_{rdcd}$ will be directed to the first current source 27 but the current $I_{rdcd}/A$ will be directed to the second current source 28. Similar current steering takes place in the second reference transistor 52 and the second subtraction transistor 62. After the switch 64 is turned on, therefore, Plot 75 in FIG. 2 corresponds to this situation as it is similar to the plot 71 but has a maximum amplitude of $I_{rdcd}$. Plot 76 is a mirror image of plot 75 and, together, they represent the vernier's transfer characteristic after the switches 64 have been turned on.

The intersection of the differential input signal 73 with the transfer characteristic represented by plots 75 and 76 generates a corresponding differential output signal 78 which would issue from the output port (23 in FIG. 1) when the pair 60 of subtraction transistors 61 an 62 is turned on by the first bit $D_0$ of the digital command signal 24. The difference between the differential output signals 74 and 78 indicates the gain reduction that is realized when the pair 60 of subtraction transistors is turned on.

The remaining pairs 60 of subtraction transistors 61 and 62 will cause additional gain reductions as their corresponding switches are also turned on by corresponding bits of the digital command signal 24. Gain-reduction arrows 80 indicate this further reduction and plots 81 and 82 (shown in light broken lines) represent the transfer characteristic when all switches have been turned on. In a significant feature of the present invention, the graph 70 of FIG. 2 illustrates an absence of DC currents so that no DC offset current issues from the differential output port (23 in FIG. 1) as the vernier 20 is commanded to any of its gain reduction steps. This is particularly important when the vernier is combined with a multiplying digital-to-analog converter (MDAC) that is sensitive to any DC currents at its input port.

Various gain reduction patterns can be established with appropriate selections of gate widths. In a first vernier embodiment, the subtraction transistors of each of the pairs 60 can have identical gate widths which are selected to realize a predetermined gain reduction as each pair is enabled by its corresponding switches 64. For example, five of the pairs 60 could all be configured to realize a 1 dB gain reduction. A 5 dB gain reduction would be realized, therefore, when all five pairs were turned on. If such a vernier were positioned ahead of an MDAC that had 6 db gain variation steps over an operational range, the vernier would provide a combined system that has 1 dB resolution over the entire operational range.

In a second vernier embodiment, the subtraction transistors of the pairs 60 can have different gate widths which are selected to realize different predetermined gain reductions. Corresponding to the example described above, the five pairs could be set to respectively realize 1, 2, 3, 4 and 5 dB of gain reduction as each pair's switches are turned on. This vernier would also provide five 1 dB gain reduction steps but only one pair would be enabled at each step.

FIG. 1 illustrates a vernier embodiment in which the switches 64 are positioned in the drains of the subtraction transistors 61 and 62. In other vernier embodiments, the switches can be positioned in other transistor terminals that are exemplified by the gate 91 and the source 92 of the subtraction transistor 62. The switches 64 of FIG. 1 are preferably realized with transistors such as the MOS transistor 93 which is substituted for a respective one of the switches 64 as indicated by substitution arrow 91.

Although the differences in device size can be made quite accurately with modern photolithographic manufacturing processes, it may be necessary, in practice, to trim transistors of the vernier 20 to realize a desired accuracy in the gain reduction steps. It has been found effective, for example, to combine a trim transistor in parallel with one or more of the first and second reference transistors 51 and 52 of the reference pair 50.

This process is illustrated by the trim transistors 96 which are shown in broken lines and are partially connected in parallel with the first and second reference transistors 51 and 52. Their control terminals may be connected (e.g., with other transistors) to the control terminals of the reference transistors when needed for trimming of the gain reduction steps (e.g., during test).

Figure 3:
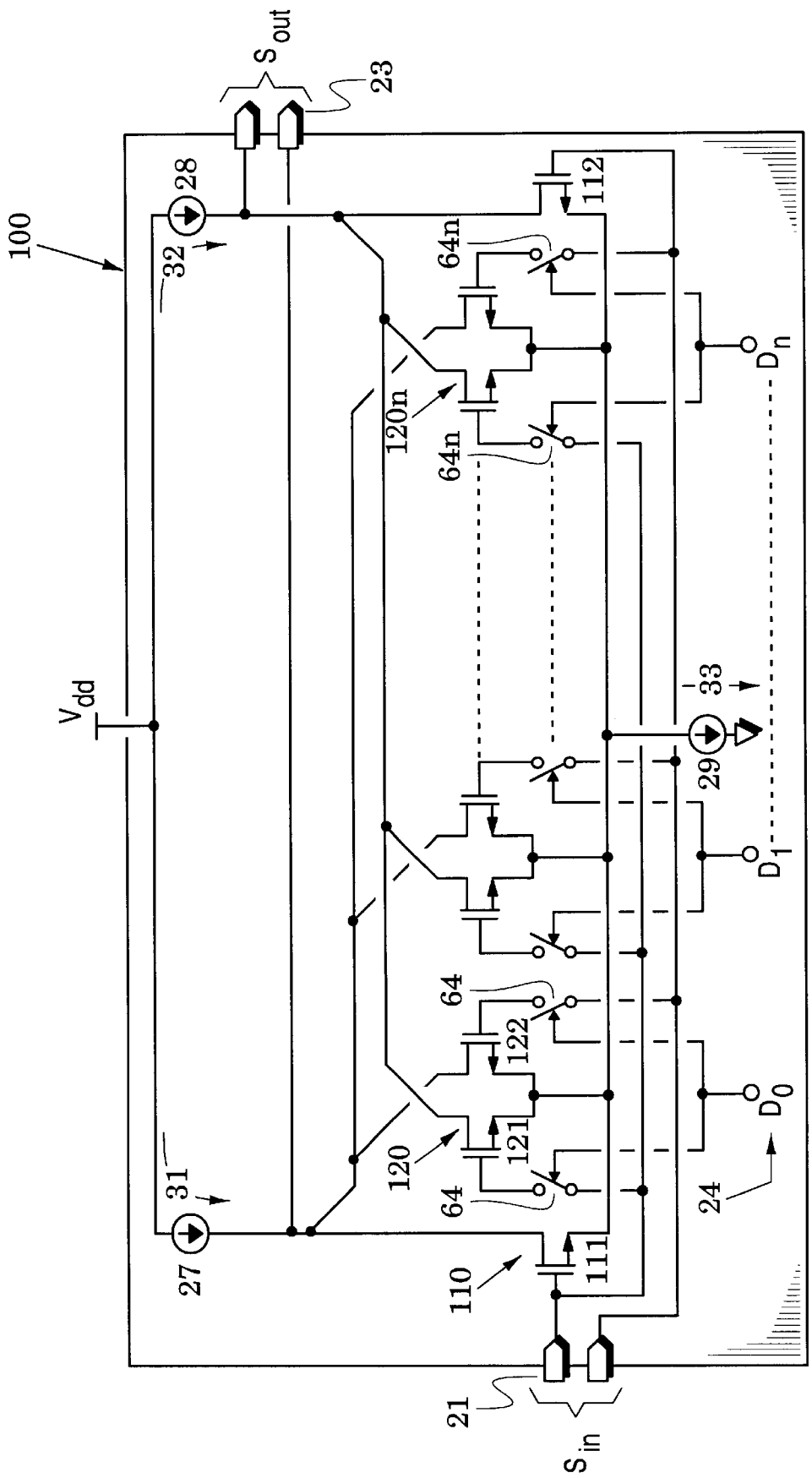
FIG. 3 is a schematic of another vernier embodiment of the present invention.

FIG. 3 illustrates another vernier embodiment 100 which includes the differential input port 21, differential output port 23, digital command signal 24 and first, second and third current sources 27, 28 and 29 of FIG. 1. The vernier 100, however, has a reference differential pair 110 of first and second reference transistors 111 and 112 and at least one subtraction differential pair 120 of first and second subtraction transistors 121 and 122.

Each subtraction differential pair 120 has a pair of switches 64 positioned in the gates of the subtraction transistors 121 and 122 and each switch pair is enabled by a respective bit of the digital command signal 24. A last subtraction differential pair 120n is shown with a pair of switches 64n that are enabled by bit $D_n$ of the digital command signal 24. Similar to the vernier 20 (in FIG. 1), the switches 64 can be positioned in other transistor terminals in other embodiments of the vernier 100.

The reference differential pair 110 is arranged to steer a portion of the third current source to the first and second current sources in response to the differential input signal $S_{in}$. Each subtraction differential pair 120 is activated by a respective bit of the digital command signal 24 and is arranged to also steer a portion of the third current to the first and second current sources but the steering is cross coupled relative to the steering of the reference differential pair.

For example, a selected polarity of the differential input signal will cause the reference differential pair 110 to increase current steered to the first current source 27 and decrease current steered to the second current source 28 while, in response to the same polarity, each subtraction differential pair 120 will decrease current steered to the first current source 27 and increase current steered to the second current source 28.

Similar to the vernier 20, the reference transistors are formed with a reference device size and the subtraction transistors are formed with a subtraction device size that is less than the reference device size. Accordingly, the reference differential pair 110 and the subtraction differential pair 120 will steer respective portions of the third current 33 that are determined by their relative device sizes.

Accordingly, each subtraction differential pair 120 will effect a gain reduction when it is activated by a respective bit of the digital command signal 24. For example, plots 71 and 72 of the graph 70 can represent the transfer characteristic of the vernier 100 when all subtraction differential pairs are not enabled and plots 75 and 76 can represent the transfer characteristic after one of the subtraction differential pairs 120 is enabled.

The remaining subtraction differential pair 120 will cause additional gain reductions as their corresponding switches are also turned on by corresponding bits of the digital command signal 24 as indicated by the gain-reduction arrows 80 in FIG. 2. The vernier 100, therefore, also provides gain reduction steps without generating DC offset currents at its differential output port 23.

Figure 4:
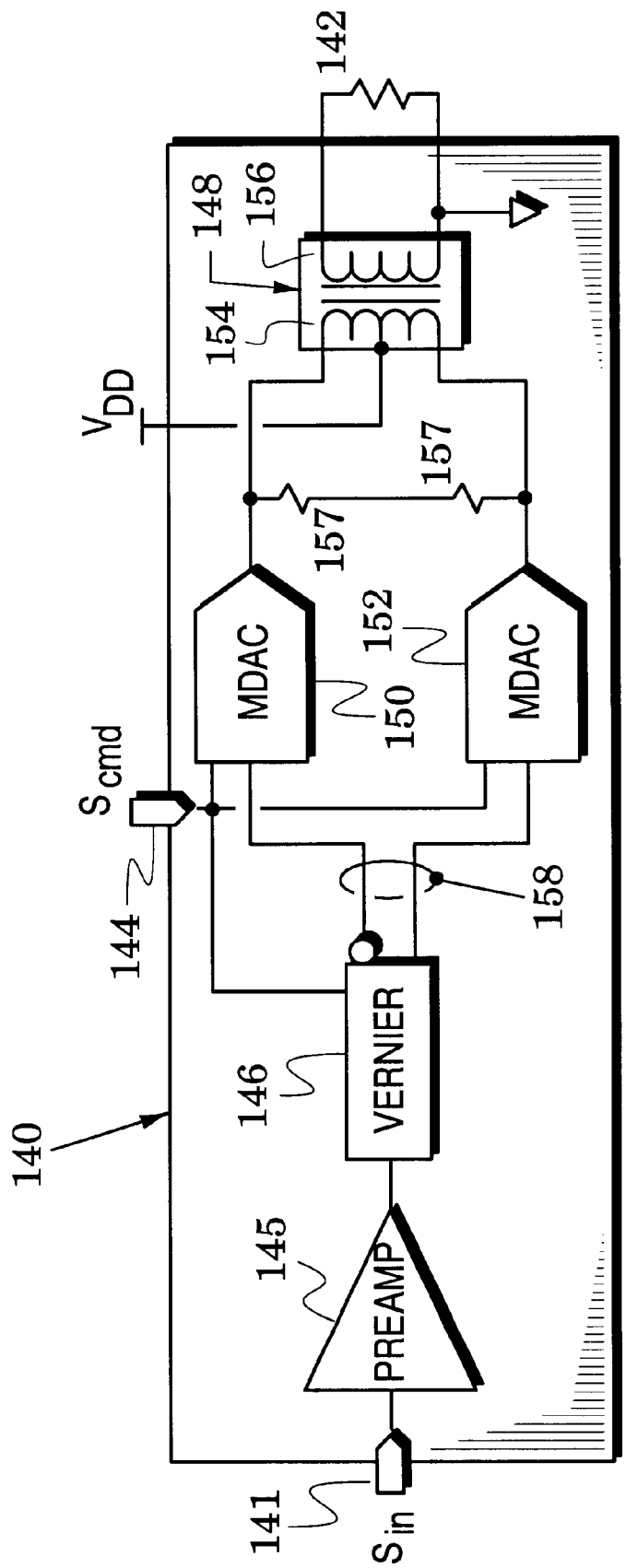
FIG. 4 is block diagram of a line driver embodiment of the present invention.

Vernier embodiments of the present invention provide advantages to various systems. FIG. 4, for example, illustrates a line driver embodiment 140 which is particularly suited for driving load impedances (e.g., the 75 ohm impedance of a coaxial cable) and is thus useful in communication applications (e.g., as a line driver in a cable modem).

In particular, the line driver 140 responds to a driver input signal $S_{in}$ at an input port 141 and drives a load impedance 142 with a gain that corresponds to a digital command signal $S_{cmd}$ at a command port 144. The line driver includes a preamplifier 145, a vernier 146, a transformer 148 and first and second MDACs 150 and 152.

The transformer 148 includes an input (primary) winding 154 which has a center tap to receive a bias voltage source $V_{DD}$ and has an output (secondary) winding 156 which is coupled across the load impedance 142 (which may represent the impedance of a coaxial cable). Resistors 157 are preferably coupled across the input winding to enhance impedance matching across the transformer 148.

The preamplifier 145 primarily acts as a buffer to couple the differential input signal $S_{in}$ to the vernier 146 which provides a differential vernier signal 158. Each of the MDACs 150 and 152 is arranged to receive a respective side of the differential vernier signal 158 and drive a respective side of the input winding 154.

In response to the differential vernier signal, each of the MDACs 150 and 152 generates an AC current signal whose phase is spaced 180° from the phase of the AC current signal from the other MDAC. Accordingly, an AC output current signal flows through the input winding and the transformer 148 generates an output current signal which flows through the load impedance 142.

In an exemplary line driver embodiment, each of the MDACs 150 and 152 would be configured to provide 6 dB steps in the AC output current signal (through the input winding 154) and the vernier would be configured to provide 1 dB steps which would thus provide an AC output current signal with a 1 dB resolution.

In an important feature of the invention, the vernier 146 substantially eliminates DC offset signals in its differential vernier signal 158. Accordingly, spurious signals are substantially reduced in the load impedance 142.

Although verniers 20 and 100 have been illustrated in FIGS. 1 and 3 with MOS transistors, the teachings of the invention can be practiced with various other transistor types. For example, bipolar junction transistors can be substituted as exemplified by the transistor 160 which is substituted by substitution arrow 161 in FIG. 1 for the second subtraction transistor 52.

The concept of gain has been used in the above description of embodiments of the invention. It is intended that this concept is broadly interpreted and it, accordingly, refers to any change of signal amplitude whether that change is an increase or a decrease of signal amplitude.

Reference has been made above to differential pairs of transistors and to pairs of transistors. Differential pairs differ from pairs in that they have current terminals (sources) coupled to receive the same signal or circuit parameter (e.g., the current of a current source).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A vernier that converts a differential input signal to a differential output current with a conversion gain that corresponds to a digital command signal, comprising:

first, second and third current sources that respectively provide first, second and third currents.

an input differential pair of first and second input transistors arranged to steer said third current along first and second current paths in response to said differential input signal;

first and second reference transistors that have first and second reference device sizes and that respectively couple said first current path to said first current source and couple said second current path to said second current source; and at least one pair of first and second subtraction transistors that have first and second subtraction device sizes that are less than said first and second reference device sizes and that, in response to said digital command signal, respectively couple said first current path to said second current source and couple said second current path to said first current source;

wherein said differential output current is generated by differences between said first and second currents and those portions of said third current that are directed towards or away from said first and second current sources.

2. The vernier of claim 1, wherein said third current substantially equals the sum of said first and second currents.

3. The vernier of claim 2, wherein said first and second currents are substantially equal.

4. The vernier of claim 1, wherein said first and second reference transistors and said first and second subtraction transistors are biased by a common reference signal.

5. The vernier of claim 1, wherein said first and second reference device sizes are substantially equal and said first and second subtraction device sizes are substantially equal.

6. The vernier of claim 1, wherein all first and second subtraction transistors have substantially equal subtraction device sizes.

7. The vernier of claim 1, wherein one pair of first and second subtraction transistors have subtraction device sizes that differ from the subtraction device sizes of another pair of first and second subtraction transistors.

8. The vernier of claim 1, further including, for each pair of first and second subtraction transistors, first and second switches that are inserted in series with a terminal of said first and second subtraction transistors respectively wherein said first and second switches respond to a respective bit of said digital command signal.

9. The vernier of claim 1, further including at least one trim transistor that is selectively coupled in parallel with one of said first and second reference transistors to adjust said differential output current.

10. The vernier of claim 1, wherein said first and second input transistors, said first and second reference transistors and said first and second subtraction transistors are metal-oxide-semiconductor transistors.

11. The vernier of claim 1, wherein said first and second input transistors, said first and second reference transistors and said first and second subtraction transistors are bipolar junction transistors.

12. A vernier that converts a differential input signal at first and second sides of an input port to a differential output current with a conversion gain that corresponds to a digital command signal, comprising:

first, second and third current sources that respectively provide first, second and third currents;

a reference differential pair of first and second reference transistors that is arranged to steer a portion of said third current source to said first and second current sources in response to said differential input signal wherein said first and second reference transistors have first and second reference device sizes; and at least one subtraction differential pair of first and second subtraction transistors that is arranged to steer, in response to said digital command signal, another portion of said third current to said first and second current sources in response to said differential input signal wherein said subtraction differential pair is cross coupled relative to said reference differential pair and wherein said first and second subtraction transistors have first and second subtraction device sizes that are less than said first and second reference device sizes;

wherein said differential output current is generated by differences between said first and second currents and those portions of said third current that are coupled to said first and second current sources.

13. The vernier of claim 12, wherein said third current substantially equals the sum of said first and second currents.

14. The vernier of claim 13, wherein said first and second currents are substantially equal.

15. The vernier of claim 12, wherein said first and second reference device sizes are substantially equal and said first and second subtraction device sizes are substantially equal.

16. The vernier of claim 12, wherein the first and second subtraction transistors of all of said subtraction differential pairs have substantially equal subtraction device sizes.

17. The vernier of claim 12, wherein the first and second subtraction transistors of one of said subtraction differential pairs have subtraction device sizes that that differ from the subtraction device sizes of another of said subtraction differential pairs.

18. The vernier of claim 12, further including, for each subtraction differential pair, first and second switches that respond to said digital command signal and are respectively inserted in series with a terminal of that pair's first and second subtraction transistors.

19. The vernier of claim 12, wherein said first and second input transistors, said first and second reference transistors and said first and second subtraction transistors are metal-oxide-semiconductor transistors.

20. The vernier of claim 12, wherein said first and second input transistors, said first and second reference transistors and said first and second subtraction transistors are bipolar junction transistors.

21. A line driver that responds to a driver input signal and drives a load impedance with a gain that corresponds to a digital command signal, comprising:

a vernier that generates a differential current signal in response to said driver input signal;

a transformer that has an input winding and also has an output winding for coupling across said load impedance; and first and second multiplying digital-to-analog converters (MDACs) that are each coupled to receive a respective side of said differential current signal and drive a respective side of said input winding;

wherein said vernier includes:

a) first, second and third current sources that respectively provide first, second and third currents.

b) an input differential pair of first and second input transistors arranged to steer said third current along first and second current paths in response to said differential input signal;

c) first and second reference transistors that have first and second reference device sizes and that respectively couple said first current path to said first current source and couple said second current path to said second current source; and d) at least one pair of first and second subtraction transistors that have first and second subtraction device sizes that are less than said first and second reference device sizes and that, in response to said digital command signal, respectively couple said first current path to said second current source and couple said second current path to said first current source;

wherein said differential output current is generated by differences between said first and second currents and those portions of said third current that are directed towards or away from said first and second current sources.

22. The line driver of claim 21, further including a preamplifier inserted between said driver input signal and said vernier.

23. A line driver that responds to a driver input signal and drives a load impedance with a gain that corresponds to a digital command signal, comprising:

a vernier that generates a differential current signal in response to said driver input signal;

a transformer that has an input winding and also has an output winding for coupling across said load impedance; and first and second multiplying digital-to-analog converters (MDACs) that are each coupled to receive a respective side of said differential current signal and drive a respective side of said input winding;

wherein said vernier includes:
   a) first, second and third current sources that respectively provide first, second and third currents.
   b) a reference differential pair of first and second reference transistors that is arranged to steer a portion of said third current source to said first and second current sources in response to said differential input signal wherein said first and second reference transistors have first and second reference device sizes; and
   c) at least one subtraction differential pair of first and second subtraction transistors that is arranged to steer, in response to said digital command signal, another portion of said third current to said first and second current sources in response to said differential input signal wherein said subtraction differential pair is cross coupled relative to said reference differential pair and wherein said first and second subtraction transistors have first and second subtraction device sizes that are less than said first and second reference device sizes;

wherein said differential output current is generated by differences between said first and second currents and those portions of said third current that are coupled to said first and second current sources.

24. The line driver of claim 23, further including a preamplifier inserted between said driver input signal and said vernier.

* * * * *